US007154978B2

(12) United States Patent
Juan et al.

(10) Patent No.: US 7,154,978 B2
(45) Date of Patent: Dec. 26, 2006

(54) CASCADED DELAY LOCKED LOOP CIRCUIT

(75) Inventors: Jui-Kuo Juan, Coral Springs, FL (US); Robert E. Stengel, Pompano Beach, FL (US); Frederick J. Martin, Plantation, FL (US); David E. Bockelman, Dripping Springs, TX (US)

(73) Assignee: Motorola, Inc., Schaumburg, IL (US)

( * ) Notice: Subject to any disclaimer, the term of this patent is extended or adjusted under 35 U.S.C. 154(b) by 941 days.

(21) Appl. No.: 10/000,914

(22) Filed: Nov. 2, 2001

(65) Prior Publication Data

US 2003/0099321 A1 May 29, 2003

(51) Int. Cl.
*H03D 3/24* (2006.01)
(52) U.S. Cl. ..................... 375/376; 327/149
(58) Field of Classification Search ............... 375/373, 375/376, 374–375; 327/147, 149, 153, 156, 327/158, 161
See application file for complete search history.

(56) References Cited

U.S. PATENT DOCUMENTS

| | | | | |
|---|---|---|---|---|
| 4,742,563 A | 5/1988 | Fukumura | ............... | 455/132 |
| 5,303,400 A | 4/1994 | Mogi | ............... | 455/186.1 |
| 5,471,659 A | 11/1995 | Wong | ............... | 455/132 |
| 5,535,247 A | 7/1996 | Gailus et al. | ............... | 375/297 |
| 5,748,683 A | 5/1998 | Smith et al. | ............... | 375/347 |
| 5,821,817 A * | 10/1998 | McCorkle | ............... | 337/1 A |
| 5,913,155 A | 6/1999 | Tomiyama | ............... | 455/142 |
| 6,044,120 A | 3/2000 | Bar-David et al. | ............... | 375/347 |
| 6,100,735 A * | 8/2000 | Lu | ............... | 327/158 |
| 6,148,186 A | 11/2000 | Fujita | ............... | 455/137 |
| 6,205,193 B1 | 3/2001 | Solve et al. | ............... | 375/354 |
| 6,222,894 B1 * | 4/2001 | Lee | ............... | 375/376 |
| 6,226,505 B1 | 5/2001 | Uda | ............... | 455/255 |
| 6,236,690 B1 | 5/2001 | Mimura et al. | ............... | 375/334 |
| 6,353,649 B1 | 3/2002 | Bockleman | | |
| 6,492,851 B1 * | 12/2002 | Watarai | ............... | 327/158 |
| 6,510,191 B1 | 1/2003 | Bockelman | | |
| 6,515,633 B1 | 2/2003 | Ippolito | ............... | 343/797 |
| 6,556,630 B1 | 4/2003 | Brinsfield et al. | ............... | 375/335 |
| 6,735,669 B1 * | 5/2004 | Shin | ............... | 711/106 |
| 2002/0032042 A1 | 3/2002 | Poplawsky et al. | | |
| 2003/0119465 A1 | 6/2003 | Martin | | |
| 2003/0152181 A1 | 8/2003 | Stengel et al. | | |

OTHER PUBLICATIONS

Jerry D. Gibson, "The Communications Handbook", 1997, CRC Press, p. 11.

* cited by examiner

*Primary Examiner*—Khanh Tran

(57) ABSTRACT

A delay locked loop frequency synthesizer in several embodiments uses a primary delay line element (24) and one or more secondary delay elements (162 . . . 164, 270, 310). In one embodiment, a main delay line (24) is used to coarsely select a frequency output while a secondary delay element (162 . . . 164, 270, 310), either passive or active, is used to increase the resolution of the primary delay line (24). In the passive embodiment, a coarse and fine frequency selection is possible by selecting components from the output taps of the main delay line (24) as a driving signal for the passive secondary delay element (310) to provide the coarse adjustment and selecting an output from the secondary delay element (310) to provide the fine selection.

38 Claims, 12 Drawing Sheets

CASCADED DELAY LOCKED LOOP CIRCUIT

CROSS REFERENCE TO RELATED DOCUMENTS

This application is related to U.S. patent application Ser. No. 09/633,705, filed Aug. 7, 2000 to Frederick Lee Martin entitled "Digital-To-Phase Converter" which is hereby incorporated herein by reference.

FIELD OF THE INVENTION

This invention relates generally to the field of delay locked loops. More particularly, this invention relates to delay locked loop based frequency synthesizers with improved frequency resolution.

BACKGROUND OF THE INVENTION

A delay locked loop (DLL) synthesizer can potentially be used as a frequency synthesizer in many electronic devices such as wireless telephones (e.g., cellular telephones), two-way radio transceivers, radio transmitters and radio receivers. Such synthesizers are sometimes referred to as digital to phase converters (DPC). However, to effectively use a DLL in such applications, frequency output should be accurate and relatively free of spurious content. In many applications, it may also be important that the DLL architecture is designed to optimize noise, and power dissipation performance parameters.

In order to utilize DLL technology in many direct digital synthesis (DDS) applications, the frequency resolution obtainable with known technology is inadequate when considered in light of constraints on noise, power consumption and spur generation parameters.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
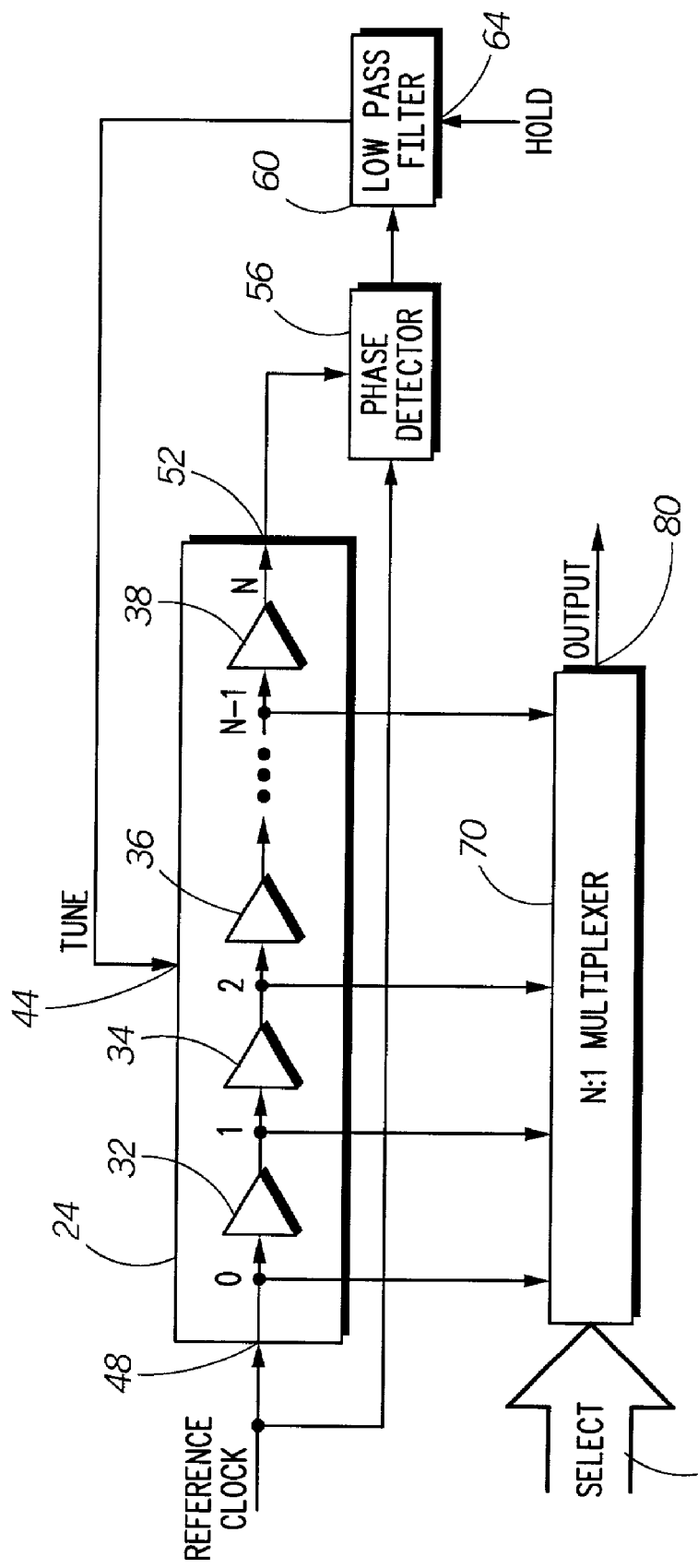
FIG. 1 is an exemplary block diagram of a basic delay locked loop circuit.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Turning now to FIG. 1, a basic delay locked loop circuit 20 is illustrated. This circuit is similar to that found in U.S. patent application Ser. No. 09/633,705 filed Aug. 7, 2000 to Frederick Lee Martin entitled "Digital-To-Phase Converter" which is hereby incorporated by reference. In this delay locked loop circuit 20, a delay line 24 is made up of a plurality of cascaded controlled delay elements 32, 34, 36 through 38, each having an input and an output. In delay line 24, N such delay elements are provided each having a delay D. Such a delay line can be implemented using, for example, a series of inverter buffers each with a voltage controlled delay for adjustment of the value of D. Thus, delay line 24 has an overall delay of N×D. The overall delay of delay line 24 is tuned by a voltage (or other suitable control signal) applied to a control input 44. A suitable signal applied to input 44 simultaneously adjusts the delays of each of the N delay elements (which are preferably closely matched) to produce an overall adjustment in the delay N×D. A tapped output is available at each of the delay elements 32, 34, 36 through 38 having a total amount of delay dependent upon the number of delay elements encountered from the input of the delay line 24.

In delay locked loop 20, a clock signal is applied to an input 48 and, after encountering N×D delay, exits at output 52. The output at 52 and the input at 48 are each applied to a phase detector 56 that produces an output that represents the difference in phase between the two inputs. This output is filtered by a low pass filter 60. The output of the low pass filter 60 drives the control input 44 to effect a tuning of the delay line 24 so that the delay line 24 is adjusted to produce an output at output 52 that is a total of a predetermined delay from the input signal applied at input 48. One choice for the delay would be one input clock cycle or $1/F_{REF}$.

Delay line 24, as shown, has an input 48 which is equivalent to the $0^{th}$ tap and an output 52 which is the output of the last ($N^{th}$) delay element of the delay line in the embodiment shown. Thus, the delay line 24 can be considered to have an input 48 and N+1 outputs. However, when the input 48 and output 52 are locked in the delay locked loop arrangement shown, they constitute essentially the same signal (after a startup period during which time the loop achieves lock). Accordingly, alternative equivalent embodiments may use the output 52 in place of the $0^{th}$ tap position or in addition thereto without departing from the present invention. For consistency, all examples shown herein utilize the $0^{th}$ tap as a tap output with the output of the $N^{th}$ delay element used only by the loop as an input to the phase comparator. In other words, the current embodiment uses taps 0 through N−1 for output taps for the direct digital synthesis, but those skilled in the art will appreciate that using taps 1 through N is entirely equivalent as is an embodiment using taps 0 through N.

In certain embodiments where the output frequency is significantly lower than the input reference clock frequency, there is an opportunity to reduce power consumption by turning off parts of the delay locked loop. This means that the delay locked loop is potentially running open loop during some portion of the time. For such embodiments, the low pass filter 60 may be implemented using a hold input 64 to hold the output value of the filter 60 at a fixed value in response to an appropriate input signal at 64 (thus fixing the overall delay of delay line 24) whenever necessary to keep the delay locked loop at a fixed tuning voltage. Such a hold arrangement can be implemented in a manner similar to conventional sample and hold circuits (or otherwise) and is only needed for the pulsed embodiment described. The hold signal can be produced by a microcontroller or suitable hard-wired logic. Thus, once locked, the delays can be fixed by holding the tune signal fixed for periods of time and only occasionally turned on to make adjustments to the lock.

Those skilled in the art will appreciate that the delay locked loop 20 of FIG. 1 does not illustrate special circuitry sometimes used to prevent false locking. Such circuitry can be readily added if desired or needed without departing from the invention, but is not necessary to the understanding of the present invention.

In order to produce a signal having a frequency synthesized from the clock signal input at 48, a suitable combination of output signals from the delay line's tapped outputs can be assembled to approximate the desired signal. Consider, for example and not by way of limitation, a delay locked loop circuit 20 having the following circuit parameters when locked:

Reference clock frequency=$F_{ref}$=450 Mhz

Number of delay elements=N=32

Average buffer delay=D=69.444 pico-seconds

Total Delay Line delay=N×D=2222.2 pico-seconds

For this example 32 buffers or other suitable delay elements with 69.444 p second delay each are driven with a 450 MHz input clock signal and locked to a total delay of 2222.2 pico-seconds. Each of the taps supply a 450 MHz output signal with each tap having 11.25 degrees of offset (69.444 pico-seconds delay) from the preceding tap output.

The present circuit arrangement can be used to provide direct digital selectable signals with accurate time or phase shifted relation to the input clock signal. Each of the N+1 selectable signals from the delay line 24's tap outputs have frequency and duty cycle equal to that of the input clock signal, but are shifted in time by a predictable delay. These time shifted output signals are selected (using an output control circuit arrangement) in an organized manner as a function of time to produce a new signal with independent parameters from the original input clock signal.

Figure 2:
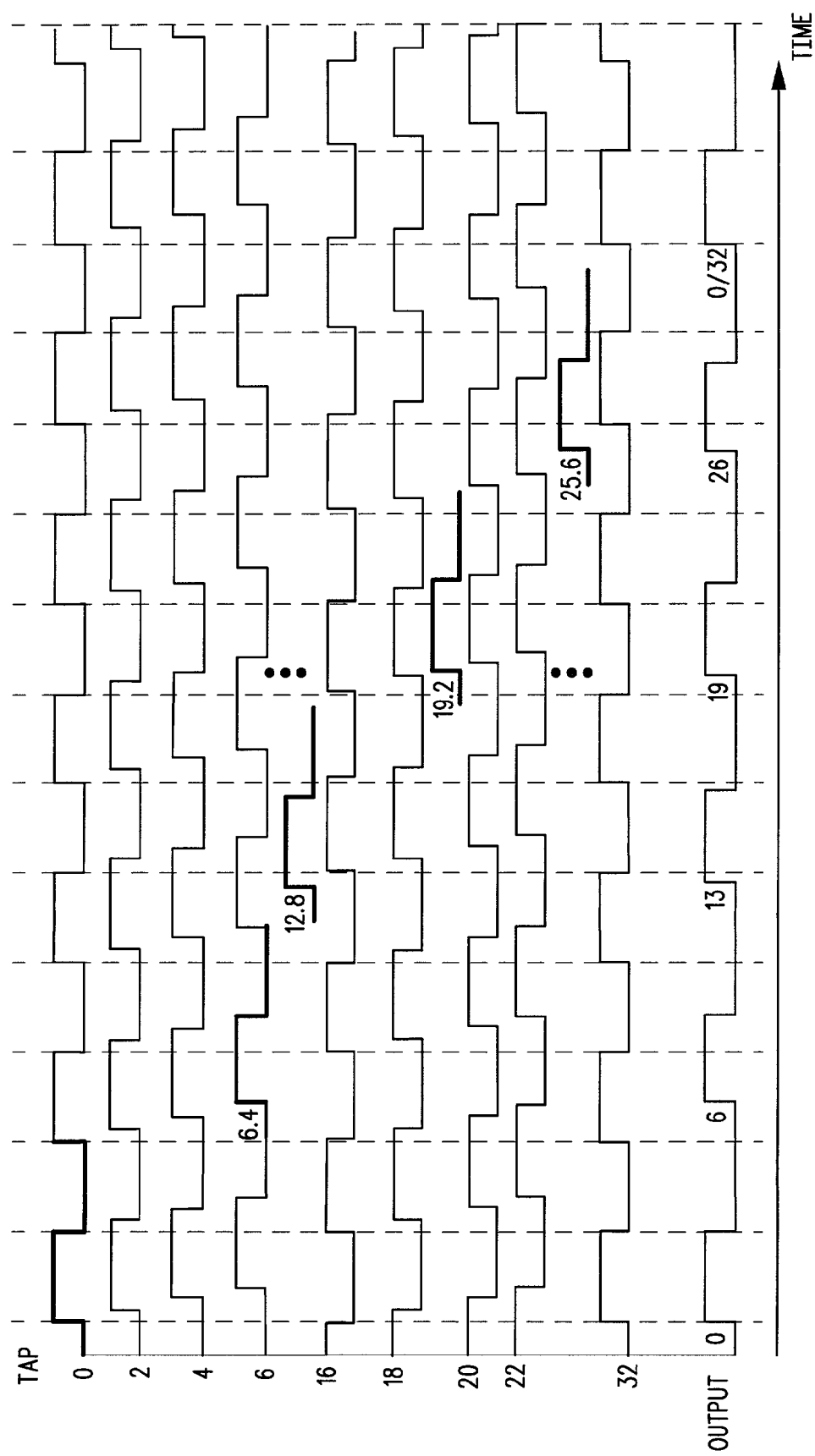
FIG. 2 is an exemplary timing diagram for a DLL having a 32 stage delay line.

The output offset of each of the tap signals is shown graphically in FIG. 2, with the tap numbers corresponding to those shown in FIG. 1. Tap 0 is 180 degrees out of phase with tap number 16; and tap 0 is identical to tap N at output 52. For the ideal condition where each of the delay buffers have identical time delay the 360 degrees is equally divided by 32 phase offset signals available at each of the 33 tap output terminals (0–31 as shown plus the N output 52). To achieve a desired output signal at a selected frequency, a function is developed to facilitate selection of the output taps.

Continuing the example with a reference clock at 450 MHz and assuming a desired output signal of 375 MHz, an input to output frequency ratio is given by:

$F_{ref}/F_{out}=K.C=450$ MHz/375 MHz=1.2

So that:

K=1

C=0.2

Where K is the number of integer cycles and C is the fractional portion of cycles of the input reference clock $F_{ref}$ relative to the desired output signal $F_{out}$. In the algorithm for tap selection, K is the number of cycles of the input clock signal that pass before the tap is selected. The decimal value C defines the tap address for the first tap selection event. For purposes of this discussion, the tap number is considered the tap address. A new tap address $C_j$ is defined by adding the fractional portion C to the previous tap address $C_{j-1}$. This is repeated until an overflow occurs, i.e., until the new tap address is greater than or equal to 1. Upon an overflow event, an additional cycle of the input clock Is allowed to pass and the fractional portion of the accumulated value is the new address. Thus, the tap address is given by:

Tap Address(j)$_{Binary}$=RND{Frac[Sum(C(j))]} for j=0, 1, 2, 3, . . .

Until Tap Address(j)≧N

The implementation of this tap selection function is accomplished with an accumulator function block, similar to those used extensively in digital signal processing.

Selection of the output using the above algorithm involves selecting taps spaced by approximately C×N taps distributed across the delay line. On the first cycle any tap could be selected to provide a time shifted offset from the reference clock signal. Returning to the example, assume the initial selection of tap 0 on the first cycle. Value C=0.2 is processed in an accumulation or summation with the initial first cycle offset of 0.0 for a second cycle result of 0.2. For this example with 32 or $2^5$ phase offsets (tap outputs), the exact delay would be represented by a tap position of 6.4. That is:

0.2/1.0=6.4/32.

Of course, only integer outputs are available, so rounding this to the closest integer results in selection of the $6^{th}$ tap. (Rounding is used in this example as a simple mechanism for approximating the exact tap value. Other techniques can also be used as will be discussed later.) The next accumulation value is given by:

0.2+0.2=0.4

Carrying out a similar calculation for 0.4/1.0 results in a tap position of 12.8 (that is, 0.4×32=12.8). This cycle, the integer rounding is up for the $13^{th}$ tap. This continues on with the fourth and fifth cycle accumulation of 0.6×32=19.2 and 0.8×32=25.6. These values round off to tap positions 19 and 26 respectively. On the sixth cycle, the accumulation overflows or becomes equal to or greater than one (with a remainder of zero for this example). Therefore, the process repeats every fifth cycle.

Thus, in order to synthesize a 375 MHz clock signal, an output selection circuit is provided that sequentially selects taps $C_j$ for the output as illustrated in TABLE 1 in the order shown with x designating the clock cycle during which the tap is selected:

TABLE 1

| $C_j$ | 0 | 6 | 13 | 19 | 26 | 0 | 6 | 13 | 19 | 26 | 0 | ... |
|---|---|---|---|---|---|---|---|---|---|---|---|---|
| J | 0 | 1 | 2 | 3 | 4 | 0 | 1 | 2 | 3 | 4 | 0 | ... |
| x | 0 | 1 | 2 | 3 | 4 | 6 | 7 | 8 | 9 | 10 | 12 | ... | as illustrated in FIG. 2.

As discussed previously, rounding can be used as a mechanism to approximate the exact tap value as in the example above. However, other rounding algorithms are possible that will improve performance with reduction in undesired spurious signal levels. Using tap 6.4 as an example, it could be rounded down to tap 6 six times out of ten tap cycles and rounded up to 7 four of the ten tap cycles. More extensive tap selection algorithms can be used to extend the accuracy to additional digits if needed. Other algorithms can also be employed such as, for example, triangular interpolation or delta-sigma (or sigma-delta) processing, manipulation of C over the cycle time, etc. Such techniques can be applied to an individual tap or to a sequence of taps to enhance the long term average accuracy without departing from the invention. Thus, in a frequency synthesizer apparatus according to the present invention, the output control circuit can be designed to select taps based upon an algorithm that interpolates fractional tap values by selecting integer tap values that vary as the tap cycle repeats to enhance the accuracy of the frequency synthesis.

TABLE 2 below lists several additional examples of the sequence of taps used to generate various output signals by sequentially selecting taps for the output in the order shown using DLL 20 and an input clock frequency of 450 MHz (with the details left to the reader):

TABLE 2

| OUTPUT FREQUENCY | $F_{REF}/F_{OUT}$ | REPEATING TAP ADDRESS SEQUENCE |
|---|---|---|
| 120 MHz | 3.75 | 0, 24, 16, 8, 0, 24, 16, 8, ... |
| 300 MHZ | 1.5 | 0, 16, 0, 16, ... |
| 600 MHZ | 0.75 | 0, 24, 16, 8, 0, 24, 16, 8, ... |
| 1100 MHz | 0.4090909... | 0, 13, 26, 7, 20, 1, 15, 28, 9, 22, 3, 16, 29, 10, 23, 4, 17, 31, 12, 25, 6, 19, 0, ... |

These examples illustrate that the tap sequence can vary from a short sequence of taps to a very long sequence depending upon the frequency being synthesized and it's relationship to the clock frequency.

The number taps in the tap sequence before it repeats can be determined by reducing the frequency ratio $F_{ref}/F_{out}$ to its least common factors. The denominator integer of the lowest common factor in the ratio $F_{ref}/F_{out}$ is the length of the tap sequence before it repeats. For example, $F_{ref}$=450 MHz and $F_{out}$=1100 MHz, K.C=450×10$^6$/1100×10$^6$=9/22. Thus, there are 22 taps in the sequence before it repeats.

In cases where there is no common factors for both the input clock frequency and the output frequency, there may theoretically be no repeating sequence. Owing to the finite resolution of an accumulator, for most practical applications the pattern is likely to ultimately repeat, albeit after a very long sequence. It is also noted that the same sequence of tap addresses can be used to synthesize a number of different frequencies (e.g., 120 MHz and 600 MHz). This is because up to this point, the tap addresses have been defined, but there has been no determination as to when in time the tap addresses are selected to accomplish the desired frequency synthesis of $F_{out}$—only the tap addresses and the order of their selection have been defined. That is, nothing has been said regarding when any of the selected taps is to be addressed as an output.

In order to synthesize the frequency $F_{out}$ using the current DLL 20, an output signal from a selected tap is produced at increments in real time having a period defined by 1/$F_{out}$. In order to accurately approximate this spacing using a single finite length delay line 24, taps may have to be selected during each cycle of the input reference clock or, there may be cycles of the input reference clock in which no tap output is selected. In the above example where $F_{out}$ is 375 MHz and $F_{ref}/F_{out}$=K.C=450 MHz/375 MHz=1.2, the ratio K.C defines the time spacing in relation to a single reference clock cycle separating the selection of a tap to produce an output. That is, in this example, an output is produced every 1.2×N×D seconds. Thus, one tap output is selected every time 1.2×N×D seconds pass. If there is no initial phase offset, and the first tap selected is tap zero of delay line 24, TABLE 3 below defines the tap selection sequence as it relates to a given reference clock cycle for several of the example output frequencies assuming a first tap output of tap zero (i.e., no phase offset):

TABLE 3

| CLOCK CYCLE | 150 MHZ TAP SELECTION | 400 MHZ TAP SELECTION | 600 MHZ TAP SELECTION |
|---|---|---|---|
| 1 | 0 | 0 | 0, 24 |
| 2 | None | None | 16 |
| 3 | None | 6 | 8 |
| 4 | 24 | None | 0, 24 |
| 5 | None | 13 | 16 |
| 6 | None | None | 8 |
| 7 | None | 19 | 0, 24 |
| 8 | 16 | None | 16 |
| 9 | None | 26 | 8 |
| 10 | None | None | 1, 24 |
| 11 | None | 0 | 16 |
| 12 | 8 | None | 8 |
| 13 | None | 6 | 0, 24 |
| 14 | None | None | 16 |
| 15 | None | 13 | 8 |
| 16 | 0 | None | 0, 24 |
| 17 | None | 19 | 16 |
| 18 | None | None | 8 |
| 19 | 24 | 26 | 0, 24 |
| 20 | ... | ... | ... |

Figure 3:
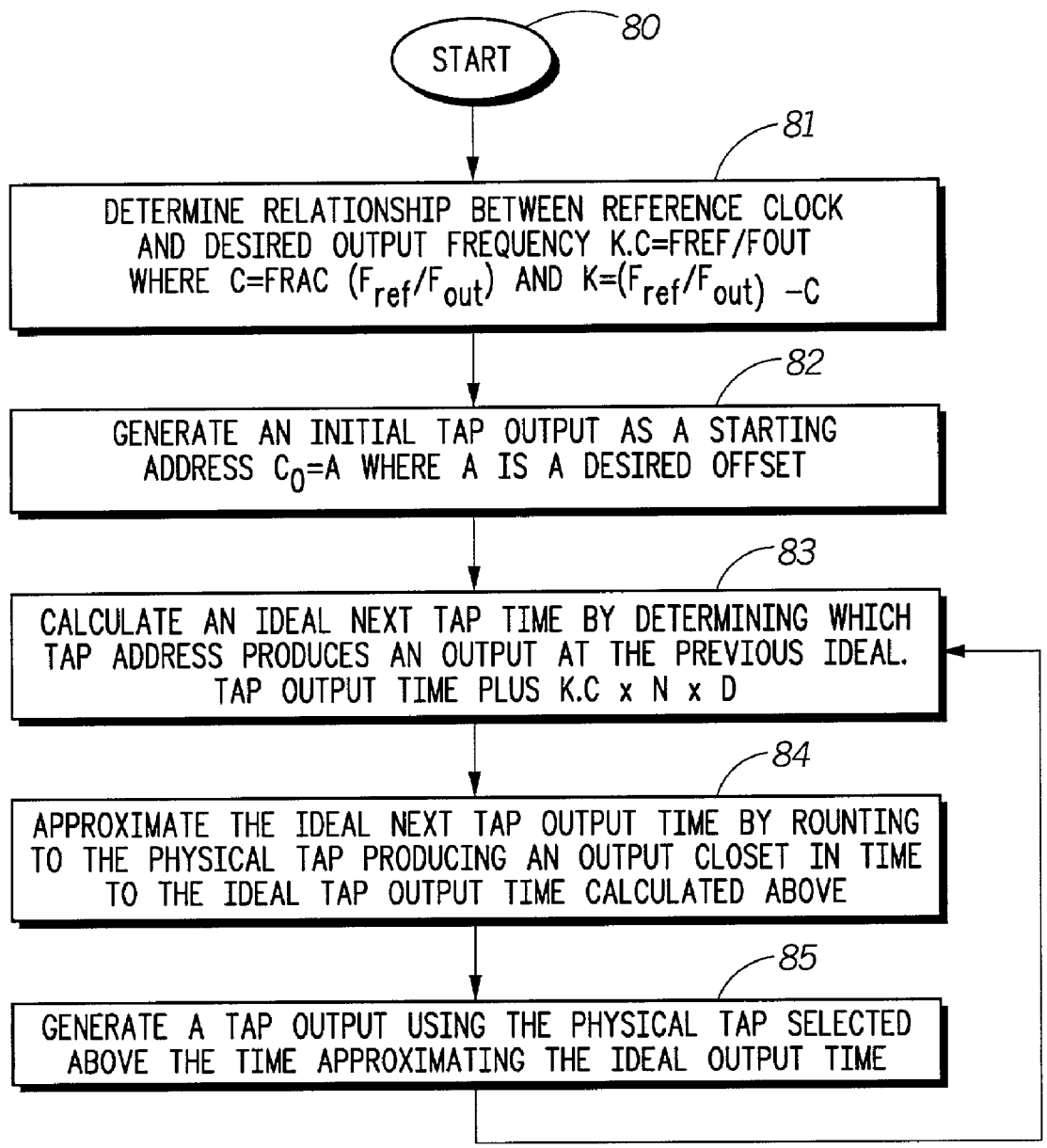
FIG. 3 is an exemplary flow chart broadly depicting one algorithm for selecting tap outputs according to an embodiment of the present invention.

FIG. 3 broadly depicts the tap selection process starting at 80. At 81, the relationship between the input reference frequency and the desired output frequency is determined, for example by calculating $F_{ref}/F_{out}$=K.C. At 82, an initial tap address is selected as a starting output $C_0$=A, where A is any desired offset. At 83, a next ideal tap time is calculated by adding K.C×N×D (the frequency ratio times the total delay of the delay line; or the frequency ratio times the period of the reference clock) to the previous ideal tap time—in this case, the time of the output of $C_0$. Ideally, a tap producing an output at this time will be selected, but depending upon the actual time calculated, it may have to be approximated by the physical tap producing an output closest time to ideal at 84. The selected tap is then output during the reference clock cycle that results in the output occurring at the desired approximate time at 85. The process is then repeated for the next output by returning to 83.

To summarize, the output control circuit selects taps based upon an algorithm that computes a ratio K.C of the clock signal's frequency to a desired output frequency where C is a fractional part and K is an integer part of the ratio. The algorithm then identifies a sequence of taps at approximately equally spaced delay increments, wherein a $j^{th}$ tap address $C_j$ is defined by $C_j=C_{j-1}+C$. The taps are then sequentially selected to produce an output at time increments approximating K.C times the reference clock period.

While this process as described in conjunction with FIG. 3 suggests a dynamic selection of taps, this should not be considered limiting. Tap values for desired output frequencies can be pre-calculated and stored in memory or in a lookup table for use, or calculated as needed upon selection of an output frequency or selected dynamically as suggested by FIG. 3.

Figure 4:
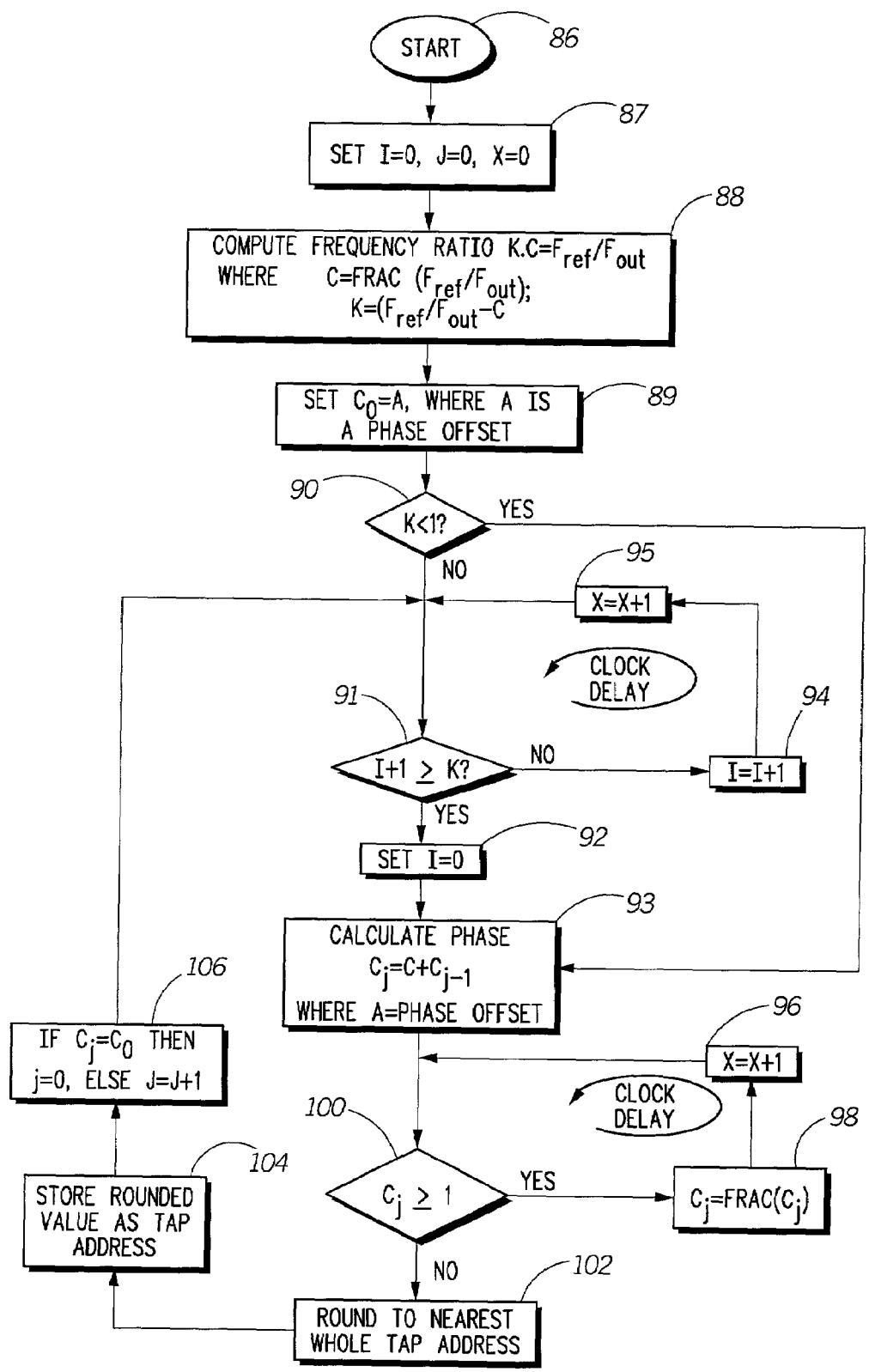
FIG. 4 is a flow chart illustrating one exemplary tap selection algorithm consistent with embodiments of the present invention.

A more detailed description of a tap selection algorithm that takes into account use of overflows in computing time between taps (due to the finite length of the delay line) is illustrated in FIG. 4. The process starts at 86 after which the values of counters j, x and i are initialized to zero at 87. Counter i is a counter that counts whole cycles until K is reached to account for any whole cycles of delay needed in the event $F_{out}<F_{ref}$. The counter j represents a number of cycles of phase accumulation before the tap selection values repeat. The counter x counts the number of clock delays. The frequency ratio K.C is calculated at 88 for the desired output frequency. At 89, the initial tap address $C_0$ is selected to equal A, where A represents any phase offset value between 0 and 1. (In the examples given above, this value was set to 0 so that the first tap address is at the 0 tap position, but in general, any arbitrary phase offset between 0 and 1 could be used.) The tap addresses $C_j$ represents a normalized decimal tap address value between 0 and 1 which indexes the selected tap. In the case of a delay line with 32 delay elements, for example, a normalized decimal tap address of any value y between 0 and 1 would map to tap number y/32. When converted to binary, the most significant bits can serve as an address for the selected tap. In the 32 delay element example above, the five most significant bits of the tap address when converted to binary can directly address the appropriate tap address.

After the initialization of tap $C_0$, control passes to 91 where the value of K is compared to 1. If K<1, the process goes directly to 93 bypassing a loop made up of 91, 94 and 95, and the tap values selected require no intermediate delays between selection of the taps. If, however, K≧1 the process goes through the loop made up of 91, 94 and 95 one or more times depending upon the values of i and K. In the event $F_{ref} \geq F_{out} \geq F_{ref}/2$, i.e., when K=1 and i<1, then only one cycle of this loop is processed. Otherwise, multiple cycles are processed indicating that the output frequency is less than half the reference frequency, and additional delays between selected tap values may be needed.

Whenever i+1≧K at 91, control passes to 92 where the counter i is reset to value zero. The exact theoretical tap address (phase) is determined at 93 by adding C to the previous tap address in an accumulation process. Unless the decimal value of the phase is greater than or equal to 1 at 100, the phase is mapped to a tap address and is rounded to the nearest actual tap address at 102. At 104, this tap address is stored for use and the value of j is incremented at 106. If $C_j$ is greater than or equal to 1 at 100 (meaning a delay of greater than one clock cycle), the fractional portion of its value is retained at 98 and x is incremented at 96, and an additional clock cycle is processed (around the loop of 100, 98 and 96). After j is incremented or reset to zero at 106 (depending upon whether or not $C_j=C_0$), control returns to 91 where the process repeats until an overflow occurs at 91. Those skilled in the art will appreciate that many variations of this process can be realized without departing from the present invention.

Referring back to FIG. 1, the outputs from the taps 0 through N−1 can be selected using an N:1 multiplexer 70 operating under control of a select signal input (or array of inputs, e.g. a select bus) to produce an output at 80 as described above to produce a desired output signal. The select signal 74 can be generated using an accumulator as described above forming a part of a clocked logic circuit with an input controlled by a microcomputer in one example. In other embodiments, the selection can be made directly by a microcomputer or microcontroller, or can be hard wired, manually switched or determined from a lookup table. Other equivalent embodiments will be evident to those of ordinary skilled in the art upon consideration of the present discussion.

Of course, because of the rounding used to make the approximation, the output in the first example above does not provide a pure 375 MHz signal. While this may not be critical in many applications, it may cause problems in other applications. By way of example, and not limitation, in the case where the DLL is used to synthesize local oscillator signals for a radio frequency transmitter and/or receiver, the impurities of the 375 MHz signal can result in undesirable or unacceptable spurious transmissions and/or receiver responses.

In order to enhance the resolution of the DLL circuit, additional delay elements can be added. However, directly adding such delays can cause poor noise performance as will be described later.

Figure 5:
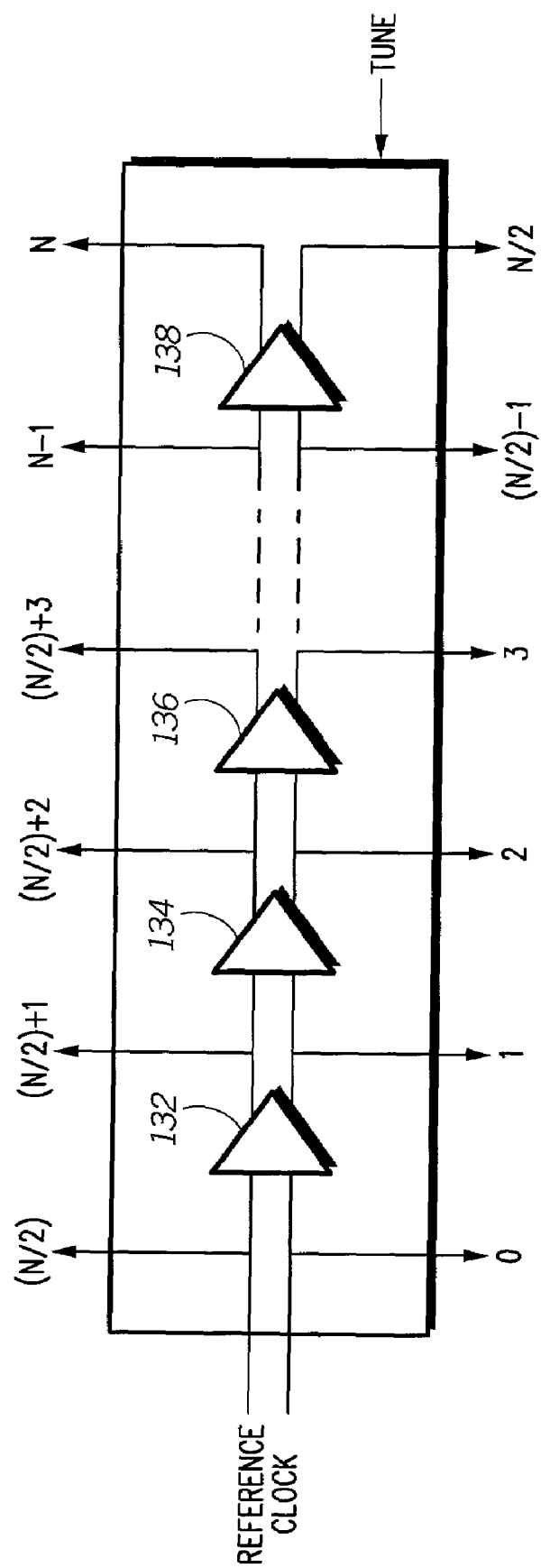
FIG. 5 is an exemplary diagram of a differential delay line consistent with certain embodiments of the present invention.

FIG. 5 illustrates an alternative embodiment for delay line 20 (shown as 120) implemented using differential buffer stages as delay elements. As shown, a reference clock can be supplied as a differential input to provide an in-phase and out-of-phase clock, but this is not to be limiting, since a single ended clock input signal could also be supplied. Due to differential operation of the buffers, all of the 0 through N output taps can be obtained with N/2 buffer elements shown as 132, 134, 136 and 138. If a differential reference clock is used, tap N/2 can be taken from either an output of buffer 138 or directly from the input clock. If a single-ended reference clock is used, the N/2 output tap is still available from an output of buffer 138. The delay of the buffers can be tuned in a conventional manner.

For a differential set of delay buffers as shown in FIG. 5, each has a pair of output terminals with output signals having 180 degrees of phase shift with respect to each other. Thus, a full 360 degree wavelength delay line could be implemented with 32 equal delay single ended buffers or 16 equal delay differential buffers. There are a number of advantages in using differential delay buffers, such as (for example):

1—rejection of common mode noise interference;
2—the delay locked loop can have accurate locking at full and half wavelength;
3—a factor of two reduction in the delay line length reduces noise by 3 dB;
4—the delay buffer can be implemented with a signal inverter in each path.

However, there is one potential disadvantage, that being the dependence on the input reference clock's duty cycle. This can result in a time offset shift between the differential output signals. The present invention can utilize either single ended or differential delay lines without limitation.

As one might expect there is a quantization impact on the spurious performance level associated with the digital to phase conversion process of a DLL. This is similar to the quantization performance of a digital-to-analog converter. The frequency offset and level of the spurs are a predictable function based on the number of accumulation cycles before the process repeats and the digital to phase resolution error.

One way to improve the spurious performance (reducing the spur level relative to the desired output signal) is to increase the number of taps or otherwise improve the phase resolution. However, adding additional delay buffers means smaller phase shift or time delay per stage for a wavelength delay line. This becomes difficult once the lowest delay limit is reached and the delay line length must span more than one wavelength of the input reference clock frequency. As the number of sequential delay stages increase there will also be an increase in the level of the output signal noise floor offset from the fundamental frequency output of the DLL.

Increasing the number of delay buffers in a manner to increase the phase resolution or decrease the quantization error will improve the spurious level. There is a 6 dB decrease in the spurious level for every factor of two increase in the number of taps or delay buffer stages. However, there is a corresponding 3 dB increase in the noise floor level as the number of buffer stages is increased by a factor of two. In order to achieve the desired output signal to noise ratio it is desirable to keep the noise floor as low as possible and maximize the output signal level at the same time. This is accomplished with maximized supply voltage level and the smallest number of delay buffer stages possible. In order to resolve the conflicting performance objectives of minimum output spurious levels and noise floor relative to the desired carrier signal, the present invention, in its several embodiments, utilizes several alternative DLL architectures.

In accordance with certain embodiments of the present invention, a delay locked loop frequency synthesizer is provided in which secondary delay line arrangements are used to increase the resolution of the primary DLL. In one embodiment, a main DLL is used to coarsely select a frequency output while a secondary delay element, either passive or active, is used to increase the resolution of the primary DLL. In the passive embodiment, a coarse and fine frequency selection is possible by selecting components from the output taps of the main DLL as a driving signal for the passive secondary delay element to provide the coarse adjustment and selecting an output from the secondary delay element to provide the fine selection. In another embodiment, a delay locked loop circuit, has a primary delay line having an input that receives a clock signal, an output and a plurality of N output taps from a plurality of delay elements, and a control input that controls an amount of delay D of delay elements based upon a control signal applied thereto. The primary delay line has a total delay of N×D. A phase comparator compares the phase of the primary delay line input with the primary delay line output and generates the control signal that sets the total delay to a desired delay. A secondary delay circuit has an input receiving a signal from a selected one of the N output taps, and a plurality of M output taps at each of a plurality of delay elements each having a delay $D_s$. The secondary delay circuit has a total delay of M×$D_s$, where M×$D_s$ is different than N×D. An output control circuit selects one or more taps from either the primary delay line or the secondary delay circuit as an output. Other embodiments are also within the scope of the present invention.

Figure 6:
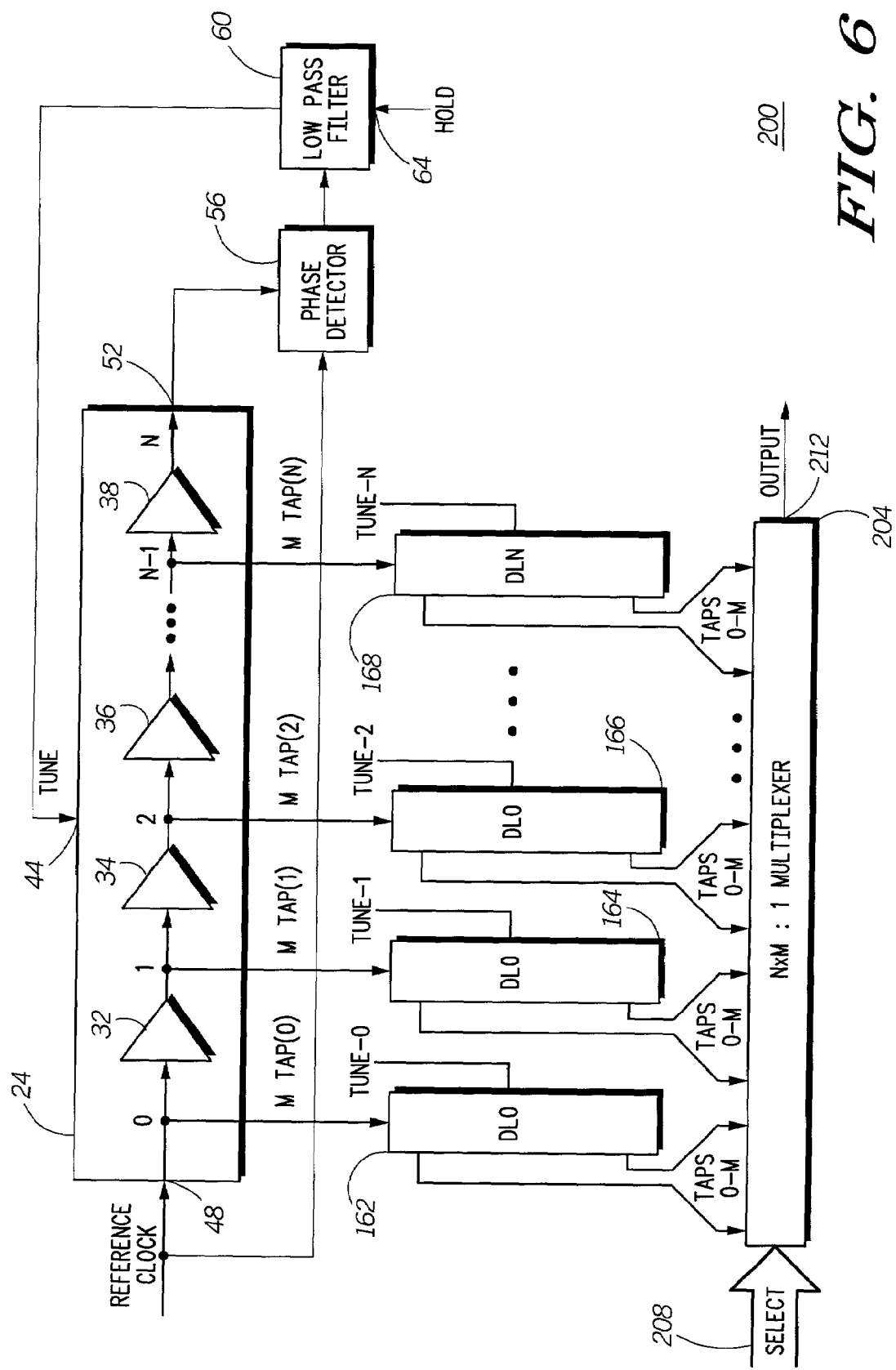
FIG. 6 is an exemplary embodiment consistent with the present invention of a DLL synthesizer using a main delay line with a plurality of cascaded secondary delay lines.

Referring now to FIG. 6, one alternative architecture consistent with an embodiment of the present invention is shown that cascades two or more delay lines to increase the phase resolution. In this particular embodiment, delay line 24 is considered a main or primary delay line. A plurality of N secondary delay lines 162, 164, 166 through 168 is used to increase the phase resolution of the DLL 200. Each of the N delay lines 162, 164, 166 through 168 has a plurality of M output taps where M is not equal to N. Preferably, M and N have no common integer factors to assure that there is an even distribution of delays available as outputs which occur at fractional intervals between those available at taps 0 through M−1. But in any event, each of the N secondary delay lines 162, 164, 166 through 168 is also delay locked to the reference clock using either a single or multiple loops similar to the main loop controlling main delay line 24. Delay lines 270 162, 164, 166 through 168 may be implemented as a differential or as a single ended delay lines.

Since M and N are not equal, different phase delays are available at each of the M×N taps of the N delay lines 162, 164, 166 through 168. Each of these M×N taps are applied to an M×N:1 multiplexer 204 and the output is selected under control of a select signal 208 to produce output signal 212. The exact algorithm used to select the particular taps depends upon the values of M and N respectively and the divide ratio required to obtain a desired output frequency, but is similar to the algorithm previously described.

In the embodiment of FIG. 6, phase resolution is increased without increasing the number of sequential delay buffer stages. The maximum number of sequential delay buffer stages is equal to the sum of the highest number of taps in each of the delay paths (i.e., M+N). With the number of taps associated with the cascade sections chosen to insure maximum phase variation, the digital to phase resolution is increased by the product of the number of taps in the cascaded delay lines (i.e., M×N). For the example shown in FIG. 6 with equal delay associated with each delay in the main delay line and equal delay associated with each delay in the secondary delay line, and assuming constant phase delay variation for every path, the resolution is the product of the number of taps in each delay line (i.e., M×N). A variety of buffer delay values and number of taps can be used in the above delay line structure with the assumption that each of the delay lines is an integer wavelength long. This assumption allows each of the delay lines to be tuned in a similar manner as that of the delay locked loop shown in FIG. 1.

By way of example, and not limitation, consider the rather simple case of:

Number of taps in main delay line=N=3=number of secondary delay line selections

Number of taps in secondary delay lines=M=5

In this example, a mapping can be created to map the tap addresses to a time delay relative to one cycle of the reference clock. In order to create M×N distinct and equally spaced delays, M and N are selected to have no common integer factors. In this example, M×N=15, and thus, 15 distinct delay values can be achieved. The delay values available are shown on TABLE 4 below, where the variable mtap(k) represents the $k^{th}$ tap of the main delay line being the secondary delay line selected and tap (I,j) represents the $j^{th}$ tap of secondary delay line i.

TABLE 4

| TAP | TOTAL DELAY FROM REFERENCE CLOCK | TOTAL DELAY FROM REFERENCE CLOCK LESS ANY FULL CYCLE DELAYS | EQUIVALENT TAP ADDRESS |
|---|---|---|---|
| mtap (0) | 0 | 0 | |
| mtap (1) | 5/15 | 5/15 | |
| mtap (2) | 10/15 | 10/15 | |
| Tap (0, 0) | 0 | 0 | 0 |
| Tap (0, 1) | 3/15 | 3/15 | 3 |
| Tap (0, 2) | 6/15 | 6/15 | 6 |
| Tap (0, 3) | 9/15 | 9/15 | 9 |
| Tap (0, 4) | 12/15 | 12/15 | 12 |
| Tap (1, 0) | 5/15 | 5/15 | 5 |
| Tap (1, 1) | 5/15 + 3/15 = 8/15 | 8/15 | 8 |
| Tap (1, 2) | 5/15 + 6/15 = 11/15 | 11/'15 | 11 |
| Tap (1, 3) | 5/15 + 9/15 = 14/15 | 14/15 | 14 |
| Tap (1, 4) | 5/15 + 12/15 = 17/15 | 2/15 | 2 |
| Tap (2, 0) | 10/15 | 10/15 | 10 |
| Tap (2, 1) | 10/15 + 3/15 = 13/15 | 13/15 | 13 |
| Tap (2, 2) | 10/15 + 6/15 = 16/15 | 1/15 | 1 |
| Tap (2, 3) | 10/15 + 9/15 = 19/15 | 4/15 | 4 |
| Tap (2, 4) | 10/15 + 12/15 = 22/15 | 7/15 | 7 |

Note that the raw delay values range from 0 to 22/15 cycles of the reference clock signal. Taking advantage of the periodic nature of the reference clock and subtracting out the full cycle delays whenever the delay is greater than one yields fifteen distinct equally spaced delays ranging from 0 to 14/15. By appropriately selecting the taps using an accumulator, multiplexer and trigger circuit, a digital to phase converter can be readily constructed. Since each DLL in the system contains only one cycle of delay, no false locking problem exists with this structure. Since the maximum number of delay stages is M+N for the cascaded structure (rather than M×N for a single DLL structure with equivalent resolution), the jitter noise is reduced.

As an illustration of the noise and power reduction, consider a 10 bit (1024 step) converter. Using N=32 and M=33, a total of 1056 steps (greater than 10 bits) can be generated using the cascade embodiment of the present invention. The maximum number of stages in the signal path is 32+33=65 contrasted with 1024 in a single DLL embodiment. Assuming equal, non-correlated jitter noise contributions for each stage, the noise reduction is:

10 log(ratio of no. of stages)=10 log(1024/65)≈12 db.

This cascade delay line structure can utilize a similar tap selection arrangement as that previously described by mapping out all of the available output delay values so that the address of a given delay value is known. An equivalent tap address as shown in TABLE 4 is then defined and used in the algorithm as before. Thus, for a frequency ratio of 1.2 for the circuit of FIG. 6, the address sequence would be given by:

0→Tap(0,0) {or mtap(0)}

0.2×16=3.2→3→Tap(0,1)

0.4×16=6.4→6→Tap(0,2)

0.6×16=9.6→10→Tap(2,0) {or mtap(2)}

0.8×16=12.8→13→Tap(2,1)

The Cascade delay line structure shown in FIG. 6 can be simplified to reduce cost, circuit size and complexity by using a multiplexer to select the delay line tap between a main and secondary delay line. The previous DLL arrangement 200 with N second stage delay lines is replaced with a multiplexer network and a single secondary delay line structure as illustrated by circuit arrangement 300 of FIG. 7. The noise and spurious performance is unchanged from the previous cascade delay line implementation. In this embodiment, the output taps mtap(0) through mtap(N) of the main delay line are each connected to an input of N:1 multiplexer 250 with an output 254 selected by select bus 260. Output 254 is connected to an input 264 of a secondary M stage delay line 270. Again, it is desirable that M and N have no common integer factors to assure that evenly spaced fractional delays between the outputs of delay line 24 can be achieved.

Each of the taps of the secondary delay line 270, labeled stap(0) through stap(M) is connected to an M:1 multiplexer 274, the output 278 of which is controlled by a select bus 280 to appropriately select a tap output for the overall output of the synthesizer. Delay line 270 may be implemented as a differential or as a single ended delay line. Again, the available output delays can be tabulated and mapped to provide a mechanism for selection of an appropriate delay.

In general, each of the delay lines should be locked to the clock signal in some manner to assure that the correct predictable delays are achieved at each tap address. This can be achieved in a number of ways. In one embodiment of the arrangement 200 of FIG. 6 a single dedicated phase detector and low pass filter network for delay buffer tuning control may be shared with a single tune signal correcting the delay of all of the secondary delay lines. Of course, in other embodiments, each delay line may individually be corrected. This is possible since each of the delay lines have a constant input and output signal that is not varied as a function of the tap selection.

Figure 7:
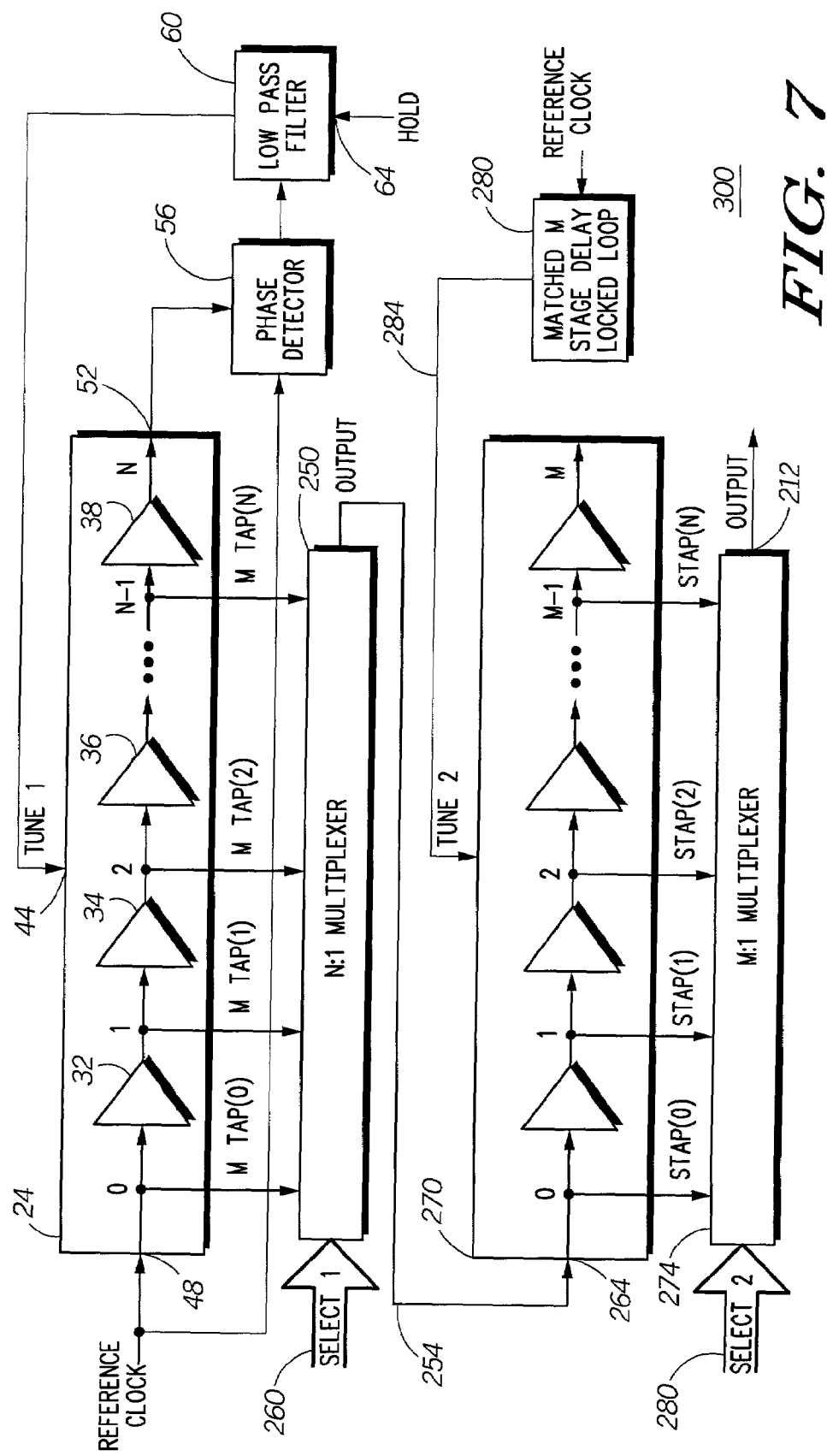
FIG. 7 is an exemplary embodiment consistent with the present invention using a cascade delay line arrangement using a multiplexer to provide an input to a single secondary delay line.

However, the multiplexed cascade delay line architecture 300 of FIG. 7 using a single secondary delay line in conjunction with the main delay line has an input signal on the secondary delay line 270 that changes in accordance with the tap selection associated with the main delay line 24. This means that the input signal at input 264 of the secondary line 270 cannot be used to continuously tune the secondary delay line 270 as a function of its final delay buffer output signal. In order to tune the secondary delay line, the current embodiment uses a matched M stage delay locked loop 280 locked to the reference clock to tune the delay line 270. Its tune control output signal 284 is applied to input TUNE2 of delay line 270. This tuning delay locked loop 280 uses an additional delay line that is closely matched to the delay line 270 of the cascade delay line structure and may be referred to herein as a dummy delay line or tuning delay line.

The tap selection algorithm for this delay locked loop structure 300 is similar to the previous example for N=3 and M=5, where Tap(x,y) is mapped to $Tap_M(x)$ and $Tap_S(y)$. $Tap_M(x)$ is applied to X:1 multiplexer 250 on select1 260, while $Tap_s(x)$ is applied to M:1 multiplexer 274 on select2 280. One drawback of the implementation in FIG. 7 is a delay of processing a signal through both main and secondary delay lines, that is not seen with the delay line configuration of FIG. 6.

Figure 8:
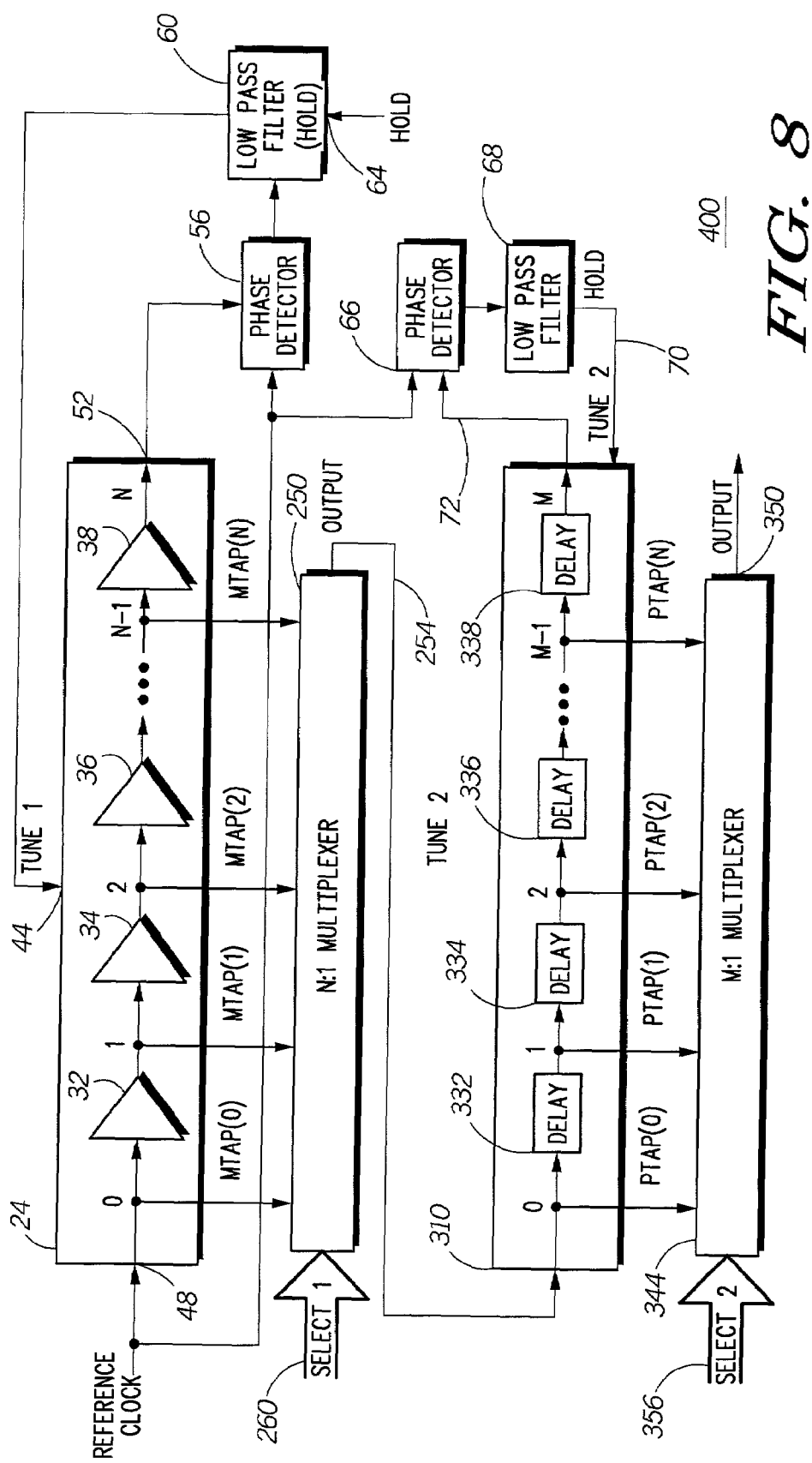
FIG. 8 is an exemplary embodiment consistent with the present invention using a passive secondary delay element.

Another embodiment of the present invention is depicted as circuit arrangement 400 of FIG. 8. This delay line architecture replaces the second active cascade delay line 270 of circuit arrangement 300 with a passive set of M delay line elements 310. These passive delay line elements provide a much smaller delay value that is used to augment the relatively large delay values of the main delay line. Ideally, such passive delay line would produce no added noise. This structure 400 produces a coarse selection of delay from the main delay line 24 and a fine selection of delay from passive delay line 310.

In this embodiment, the total delay of delay line 310 is $M \times D_p$ where $D_p$ is the delay of each passive delay element 332, 334, 336 through 338. In accordance with this arrangement, the total delay of the passive delay line $M \times D_p$ is equal to the delay of a single element in the main delay line 24 so that $M \times D_p = D$. The output 254 of multiplexer 250 drives the input of the secondary passive delay line 310. The output taps ptap(0) through ptap(M) are applied to an M:1 multiplexer 344 to produce an output 350 selected by select2 bus 356.

In order to tune the circuit arrangement 400, the following process can be applied to both the coarse and fine (main and secondary) delay lines. With the input and output applied to the phase detector of the main delay line, the loop settles to a steady state condition. Once this steady state condition is achieved, the tune voltage is held steady on delay line 24 and the input of the secondary delay element 310 (the passive delay line) is connected to the output of the N−1 output using multiplexer 250. Since the total delay of the secondary delay line output is expected to be the same as the delay between two taps of the main delay line, the total delay of delay line 310 is substituted for the last delay element (or one of the delay elements) of delay line 24. Thus, the output of the secondary delay element and the input reference clock 48 are applied to the phase detector 66 and the output of the low pass filter 68 applied to the tune input of the secondary delay line 310.

A tune2 signal for the secondary delay line can then be generated by allowing the loop to lock and this tune2 signal can be held at the tune2 input of the secondary delay line 310. Once the secondary delay line 310 is tuned, the output is reset to its normal operational position as shown. In the embodiment described, the secondary delay line 310 replaces the last delay element of the main delay line 24, however, those skilled in the art will understand that the process can be modified by substituting the secondary delay line for another delay element in the main delay line during the tuning process without departing from the invention.

This secondary delay line tuning can be done without effecting the main delay line in a locked loop condition.

Figure 9:
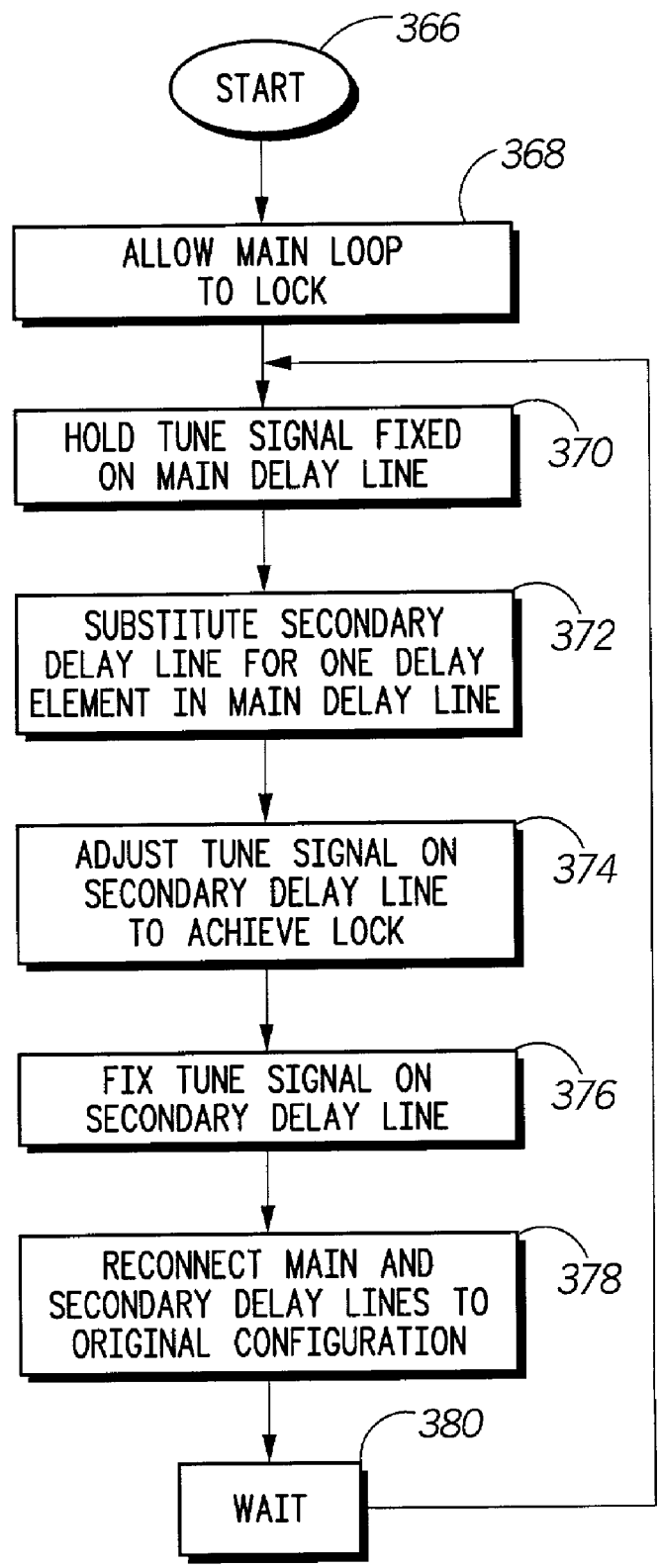
FIG. 9 is a flow chart illustrating an exemplary process for tuning a passive secondary delay element.
Figure 10:
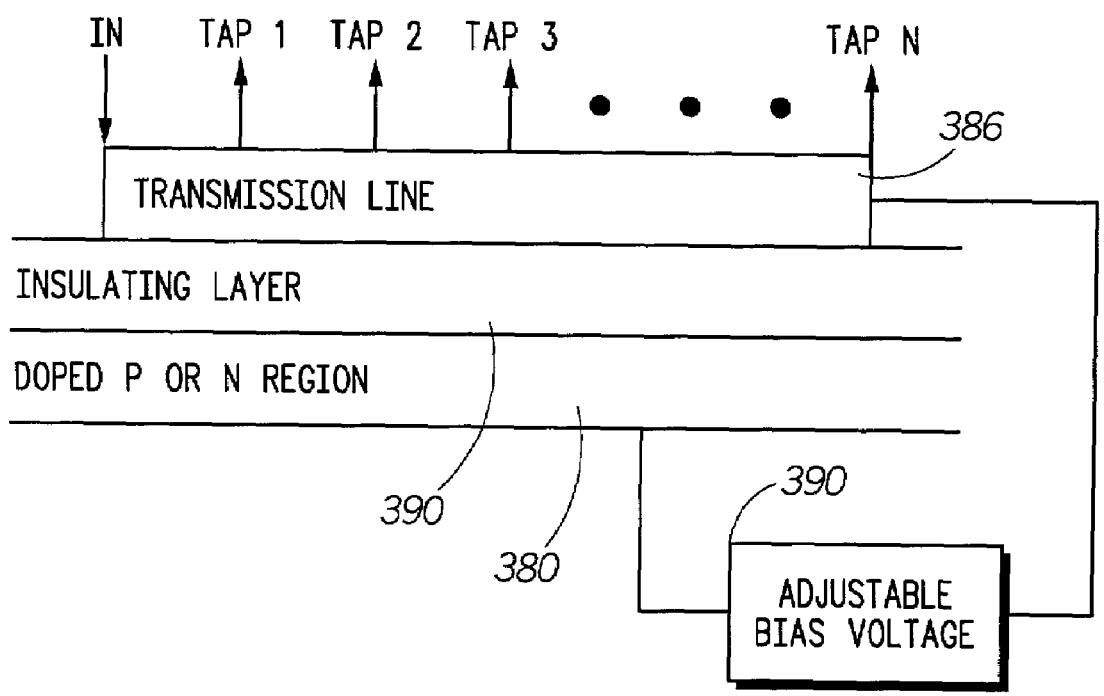
FIG. 10 illustrates an exemplary passive delay line element consistent with an embodiment of the invention.

Referring now to FIG. 9 a locking process for the DLL of FIG. 8 is described starting at 366 after which the main loop is allowed to lock at 368. Once locked, the tune signal for the main loop is fixed to hold the delay constant on the main delay line at 370. At 372, the secondary delay line is substituted for one of the delay elements of the main delay line and the tune signal of the secondary delay line is adjusted until the loop again achieves lock at 374. The tune signal for the secondary delay line is then fixed at 376. Then, the main and secondary delay lines are reconfigured to their original configuration at 378 and the process repeats as needed after an appropriate waiting period 380. Ideally all of the passive components are static in delay value over all environmental conditions and manufacturing parameters not requiring any further tuning during operation. One method of tuning the passive delay line, if required, as illustrated in FIG. 10, is to use a shunt capacitance built into a distributed conductor element that can be adjusted in value with a DC bias voltage. An example structure uses an active n- or p-doped semiconductor 382 situated under a distributed transmission line element 386 and separated by an insulating layer 390 as illustrated in FIG. 10. Application of a DC potential 390 between the transmission line conductor and the doped semiconductor material would result in an adjustable capacitance. Once the coarse main delay line 24 is tuned and the tune control signal at 44 held in value, the tunable fine delay line 310 can be placed with the detector low pass locked system by selecting the next to last coarse line tap value as previously described.

Determining the tap selection address is greatly simplified for the structure 400 when contrasted to the structure 300 or 200 with the coarse address being the most significant bits of the fractional phase and the fine address being the least significant bits of the same fractional phase value, so that:

Select Address=Select1+Select2

Where
   Select1=MSB of select address=select address applied to main delay line; and
   Select2=LSB of select address=select address applied to secondary delay line.

For example, select1 is a two bit address to address N=4 main delay taps. Select2 is a three bit address to address M=8 secondary delay taps. This produces a phase resolution of 4×8 or 32 total taps that are selected by a total of five select bits. The two most significant bits (MSB) applied to select1 and the three least significant bits (LSB) are applied to select2. Continuing with the previous example having C=0.2 the tap cycle is illustrated in TABLE 5 below:

TABLE 5

| $TAP_{decmail}$ | 0 | 6 | 13 | 19 | 26 |
|---|---|---|---|---|---|
| $TAP_{Binary}$ | 00000 | 00110 | 01101 | 10011 | 11010 |
| $TAP_{N,M}$ | 0 0 | 0 6 | 1 5 | 2 3 | 3 2 |
| | N M | N M | N M | N M | N M |

Figure 11:
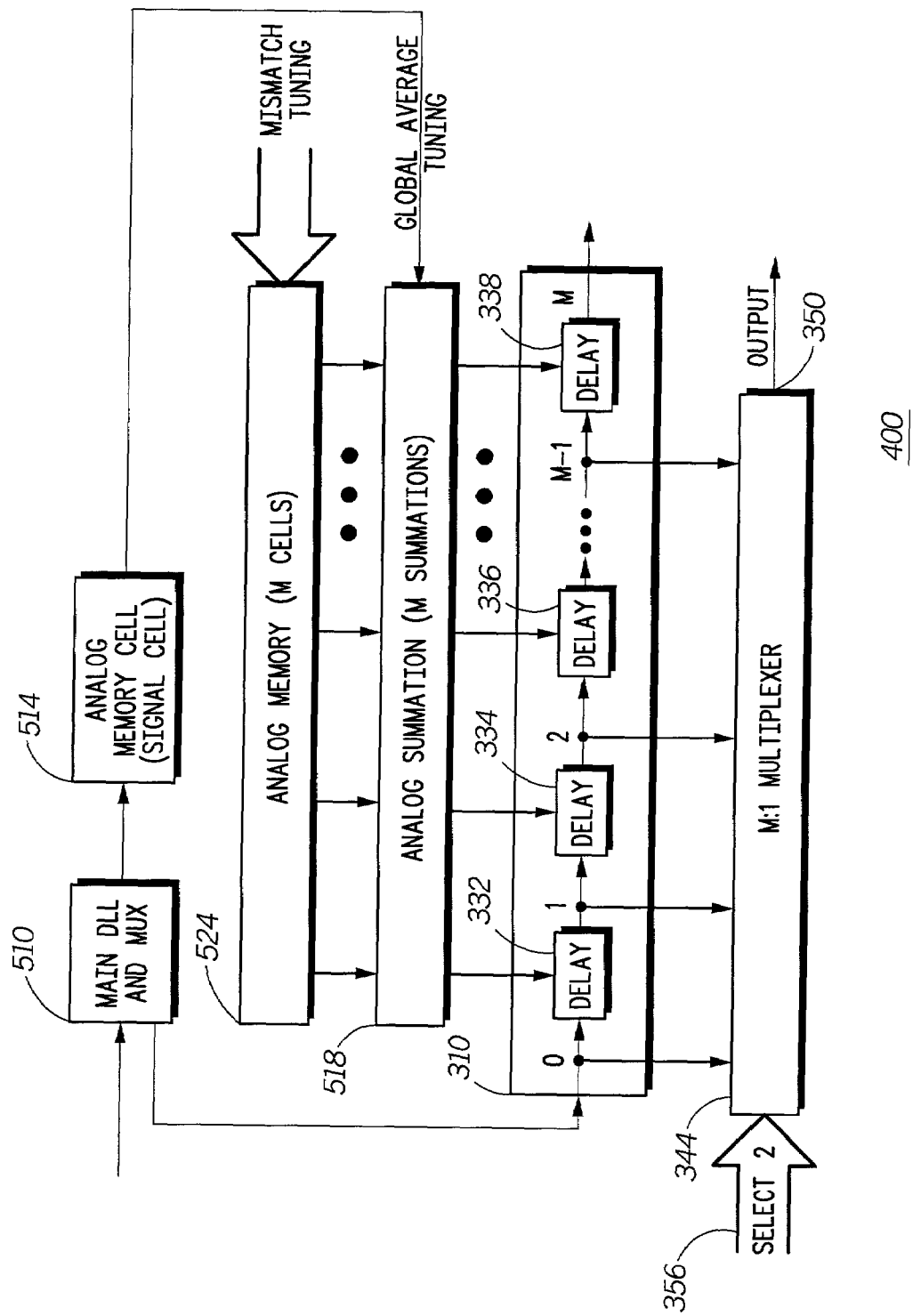
FIG. 11 is an exemplary embodiment consistent with the present invention using a passive secondary delay element with global and individual tunings on the passive delay elements.

A refinement in the delay locked loop structure of FIG. 8 is illustrated as circuit 500 in FIG. 11 in which tuning of each of the individual delay elements of the secondary delay line 310 or main delay line 510 is achieved to enhance the accuracy of the digital to phase conversion process without a lock loop. In this embodiment, a miss-match neutralization mechanism is used to reduce the variation in delays between the delay elements 332, 334, 336 through 338, with the low pass filter eliminated. The delay through each cell is adjusted to approximately the same value, reducing the delay variance along the delay line. A global adjustment is achieved as an output from the tuning of the delay line of DLL 510 which is stored in an analog memory cell 514. The tuning signal from 514 is used as a global average tuning input that is applied to a summation circuit such as an analog summation circuit 518. Individual tuning values for local corrections to the delay line 310 are stored in an array of M analog memory cells or the equivalent as in 524. Local correction values can be stored in the analog memory cells as small corrections to the global tuning value. Since the device-to-device miss-match is a static effect, the local calibration can be done once and the global tuning value tracks changes in temperature and supply voltage. The local correction values are added to the global tuning value in summation circuit 518 and individually applied to the delay elements 332, 334, 336 through 338 of delay line 310 to maintain a reduced delay variance.

The miss-match calibration can be done once in the factory by measuring a particular delay line part and generating the local correction values that are then stored in the analog memory cells 524 using the mismatch tuning input, or circuitry can be added to do the calibration in circuit. One method of measuring the delays is to use a phase detector to compare the input and output of a delay cell. The phase detector will produce a DC value and each delay cell can be adjusted to produce the same DC value at the output of the phase detector. The value of voltage required to produce this value can be stored as the local correction values. This unique local correction value represents an individual correction value applied to the specific delay buffer as it's unique integrated circuit or other process miss-match compensation. These variations are static with a one time compensation and possibly periodic aging recalibration over long periods of time. Supply voltage and temperature are additional slow miss-match delay variations that might require a more frequent compensation compared to aging. This could be accomplished with a continuous phase comparison measurement 510 of FIG. 11, with a change in value used as a global average tuning factor that is applied in the analog summation block 518. The result is the unique compensation value associated with each delay 332, 334, 336, and 338 have a unique adjustment to include supply voltage, temperature, and other environmental miss-match delay corrections. Of course, those skilled in the art will appreciate that digital storage can be used in place of analog memory cells in an alternative embodiment, with either constituting an appropriate memory for storing tuning information.

For the example delay line 24 with 32 taps as described above, this commonly amounts to up to +/−1 picosecond variation in the average buffer delay of 65.1 p seconds (at the present state of the art). The delay line tap positions that are processed through the phase detector 56 of the delay locked loop network (i.e., the first and last taps) are adjusted to an improved delay variation with an ideal value of zero. The delay variation of the other buffer stages increase for the tap positions further away from the first and last taps. Thus, the maximum delay variation occurs at the tap position midway between the locked taps. For the 32 tap example described previously, with wavelength tap positions 0 and 32 locked, the variation at tap 16 can be as high as 16 pico-seconds or about 25% of the desired individual buffer stage delay.

In each of the examples described above, the phase detector function is operating at the high frequency of the reference clock. One input to the phase detector is common with the reference clock output signal and is expected to have a duty cycle of 50%. However, the second input to the phase detector has been processed through all of the tuned delay buffer circuits. Imbalance and a number of other practical implementation issues in these delay buffer circuits will result in a duty cycle shift away from 50%. This will result in a phase detector output other than zero the idea locked value. Delay buffer implementations such as a Schmitt Trigger inverter are potential techniques to compensate for inverter difference in rise and fall time. An alternative phase detector would use an edge triggered implementation such as a divide by two function instead of an exclusive nor function for the phase detector.

Figure 12:
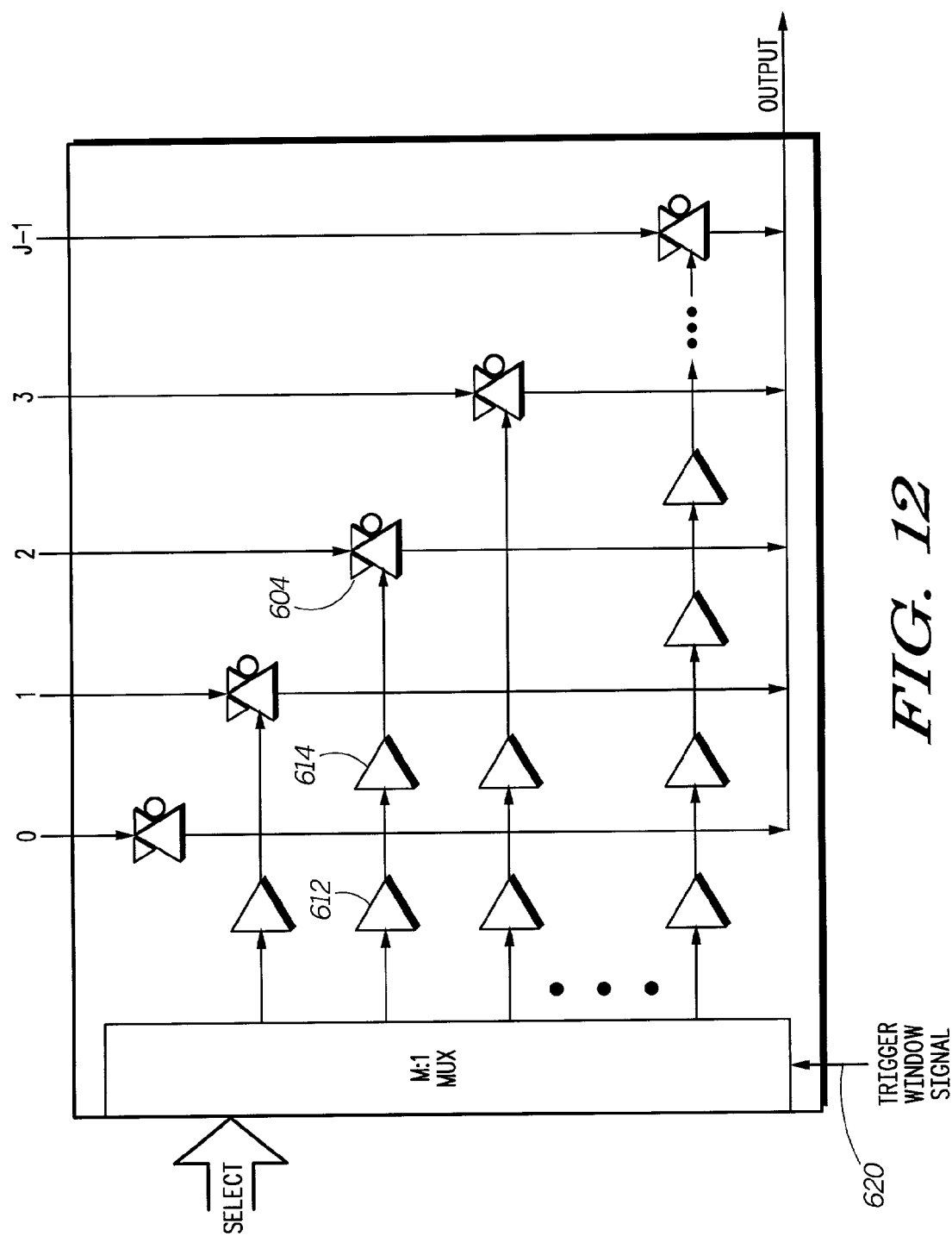
FIG. 12 illustrates an exemplary multiplexer modification to incorporate windowing and delay functions for use in the various embodiments of the present invention.

Routing of the selected delayed reference clock signal pulse to the next delay line or output port in accord with embodiments of the present invention uses a modified M:1 multiplexer gate networks. The modification uses an additional delay in each of the M addressed or selected gate switches as shown in FIG. 12. The delay is progressively increased in each of the M lines to correlate with the particular delay line tap multiplexer gate it is applied to. Thus, for example, in the case of the gate switch 604, two additional delay elements 612 and 614 are inserted in line with the select control for the gate switch. A trigger windowing signal at 620 is applied or generated, e.g. with a one shot pulse circuit and applied as an input to the circuit. The windowing trigger signal pulse duration is set slightly greater that the sum of the reference clock pulse and delay variations. For the previous 32 tap example, the worst case delay variation might be approximately 16 pico-seconds. Thus, for this example, the trigger window would have 16 pico-seconds leading and trailing to produce a trigger window of 32 pico-seconds plus a pulse width.

This trigger signal in combination with the added select line delay connects one of M delay line tap terminals to the multiplexer output terminal. This connection exist for a window in time defined by the trigger window function to facilitate routing of the desired time delayed reference clock signal. For the first delay line the trigger signal is initiated with the input reference clock signal. However, for a cascaded delay line the secondary delay line trigger is initialized with the output of the first or main delay line network.

The present invention, as described in embodiments herein, is implemented using hardware devices (i.e., delay lines, phase detectors, etc.), however, those of ordinary skill in the art will appreciate that the invention could equivalently, in certain embodiments, be implemented in whole or in part using a programmed processor executing programming instructions. Such program instructions can be stored on any suitable electronic storage medium or transmitted over any suitable electronic communication medium.

Those skilled in the art will recognize that the present invention has been described in terms of exemplary embodiments that may be based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A delay locked loop circuit, comprising:
    a primary delay line having an input that receives a clock signal and having a plurality of primary output taps;
    a secondary delay circuit having a plurality of secondary output taps, the secondary delay circuit further having an input that receives a signal from a selected one of the primary output taps; and
    an output control circuit that selects one or more taps from either the primary delay line or the secondary delay circuit as an output, wherein the output control circuit selects taps based upon an algorithm that:
    computes a ratio K.C of the clock signal's frequency to a desired output frequency where C is a fractional part and K is an integer part of the ratio; and
    identifies a sequence of taps constituting a repeating tap cycle at approximately equally spaced delay increments, wherein a $j^{th}$ tap address $C_j$ is defined by $C_j=C_{j-1}+C$.

2. The apparatus according to claim 1, wherein the primary delay line has N delay elements with each delay element having a delay of D so that the primary delay line has a total delay of N×D; and wherein the secondary delay circuit has M delay elements with each delay element having a delay of $D_s$ so that the secondary delay circuit has a total delay of M×$D_s$.

3. The apparatus according to claim 2, wherein M×$D_s$ is different than N×D.

4. The apparatus according to claim 2, wherein M and N have no common integer factors.

5. The apparatus according to claim 2, wherein the secondary delay circuit comprises a passive delay line.

6. The apparatus according to claim 5, wherein the passive delay line has a fixed total delay M×D.

7. The apparatus according to claim 6, wherein the fixed total delay M×$D_s$ is approximately equal to D.

8. The apparatus according to claim 5, wherein the passive delay line has an adjustable total delay.

9. The apparatus according to claim 1, wherein the primary delay line comprises a plurality of series connected differential delay buffers.

10. The apparatus according to claim 1, wherein the secondary delay circuit comprises a plurality of series connected differential delay buffers.

11. The apparatus according to claim 1, further comprising a multiplexer disposed between the primary delay line and the secondary delay circuit, and wherein the selected one of the primary output taps is connected to the secondary delay line by the multiplexer.

12. The apparatus according to claim 1, wherein the output control circuit comprises a multiplexer receiving signals from at plurality of the primary or secondary output taps as input signals thereto, and control logic for selecting one or more of said input signals as an output of the multiplexer.

13. The apparatus according to claim 1, wherein the output control circuit selects an output tap based upon a frequency selection input thereto.

14. A delay locked loop circuit, comprising:
    a primary delay line having an input that receives a clock signal, and having an output and having a plurality of N primary output taps from a plurality of delay elements, the primary delay line further having a control input that controls an amount of delay D of delay elements based upon a control signal applied thereto, the primary delay line having a total delay of N×D;
    a phase comparator that compares the phase of the primary delay line input with the primary delay line output and generates the control signal that sets the total delay N×D to a delay that locks the delay locked loop;
    a secondary delay circuit having an input receiving a signal from a selected one of the N output taps, and a plurality of M secondary output taps at each of a plurality of delay elements each having a delay $D_s$, the secondary delay circuit having a total delay of M×$D_s$;
    an output control circuit that selects one or more output taps from either the primary delay line or the secondary delay circuit as an output; and
wherein the output control circuit selects taps based upon an algorithm that:
    computes a ratio K.C of the clock signal's frequency to a desired output frequency where C is a fractional part and K is an integer part of the ratio; and
    identifies a sequence of taps constituting a repeating tap cycle at approximately equally spaced delay increments, wherein a $j^{th}$ tap address $C_j$ is defined by $C_j=C_{j-1}C$.

15. The apparatus according to claim 14, further comprising sequentially selecting identified taps to produce an output at time increments approximating K.C×N×D.

16. The apparatus according to claim 14, wherein the output control circuit selects taps based upon an algorithm that interpolates fractional tap values by selecting integer tap values that vary as the tap cycle repeats.

17. A delay locked loop circuit, comprising:
    a primary delay line having an input that receives a clock signal, and having an output and having a plurality of N output taps from a plurality of delay elements, the primary delay line further having a control input that controls an amount of delay D of delay elements based upon a control signal applied thereto, the primary delay line having a total delay of N×D;
    a phase comparator that compares the phase of the primary delay line input with the primary delay line output and generates the control signal that sets the total delay N×D to a delay that locks the delay locked loop;
    a plurality of secondary delay circuits, each having an input receiving a signal from one of the N output taps, and each delay element having a plurality of M output taps at each of a plurality of delay elements each having a delay $D_s$, each of the secondary delay circuits having a total delay of $M \times D_s$;

an output control circuit that selects one or more taps from either the primary delay line or the secondary delay circuit as an output; and wherein the output control circuit selects taps based upon an algorithm that:

computes a ratio K.C of the clock signal's frequency to a desired output frequency where C is a fractional part and K is an integer part of the ratio; and identifies a sequence of taps constituting a repeating tap cycle at approximately equally spaced delay increments, wherein a $j^{th}$ tap address $C_j$ is defined by $C_j = C_{j-1} C$.

18. The apparatus according to claim 17, further comprising sequentially selecting identified taps to produce an output at time increments approximating $K.C \times N \times D$.

19. The apparatus according to claim 17, wherein the output control circuit selects taps based upon an algorithm that interpolates fractional tap values by selecting integer tap values that vary as the tap cycle repeats.

20. A delay locked loop circuit, comprising:

a primary delay line having a plurality of N primary output taps;

an N:1 multiplexer receiving signals from each of the N output taps and providing a multiplexer output signal;

a passive secondary delay circuit having an input receiving the multiplexer output signal, and having a plurality of M output taps;

wherein the primary delay line has a plurality of N delay elements, each having a delay of D so that the primary delay line has a total delay of N×D; and wherein the passive secondary delay circuit has a plurality of M passive delay elements each having a delay $D_p$, the passive secondary delay circuit having a total delay or approximately $M \times D_p$, that is set by a control signal;

the control signal being determined by a tuning signal from the primary delay line that establishes a global average tuning; and further comprising a memory cell receiving the signal from the primary delay line and storing the global average tuning, and wherein the control signal to the passive secondary delay circuit is received as a fixed value of a global average tuning stored in the memory cell.

21. A delay locked loop circuit, comprising:

a primary delay line having a plurality of N primary output taps;

an N:1 multiplexer receiving signal from each of the N output taps and providing a multiplexer output signal;

a passive secondary delay circuit having an input receiving the multiplexer output signal and having a plurality of M output taps; and wherein the primary delay line has a plurality of N delay elements, each having a delay of D so that the primary delay line has a total delay of N×D; wherein the secondary delay circuit has a plurality of M passive delay elements each having a delay $D_p$, the secondary delay circuit having a total delay of approximately $M \times D_p$; wherein the delay $D_p$ of each of the M passive delay elements is set by a corresponding one of M control inputs; and wherein each of the M control inputs receives a control signal comprising a global average tuning value added to one of M individual delay element tuning values.

22. The apparatus according to claim 21, wherein the global average tuning value is determined from a tuning signal from the primary delay line.

23. The apparatus according to claim 22, further comprising a memory cell receiving a signal from the primary DLL and storing the global average tuning.

24. The apparatus according to claim 22, wherein each of the M individual delay element tuning values is stored in one of M memories.

25. The apparatus according to claim 21, wherein the M individual delay element tuning values are determined based upon delay value variations in each of the M passive delay elements.

26. A delay locked loop circuit, comprising:

a primary delay line having a plurality of N primary output taps;

an N:1 multiplexer receiving signals from each of the N output taps and providing a multiplexer output signal, the multiplexer output being selected based upon a selected signal;

a passive secondary delay circuit having an input receiving the multiplexer output signal, and having a plurality of M output taps; and wherein the select signal has least significant bits and most significant bits, and wherein taps in the primary delay line are selected by addressing a tap corresponding to the most significant bits and wherein a tap in the secondary delay circuit is selected by addressing a tap corresponding to the least significant bits.

27. A delay locked loop circuit, comprising:

a primary delay line having an input that receives a clock signal, having an output and having a plurality of N output taps from a plurality of delay elements, the primary delay line further having a control input that controls an amount of delay D of delay elements based upon a control signal applied thereto, the primary delay line having a total delay of N×D;

a phase comparator that compares the phase of the primary delay line input with the primary delay line output and generates the control signal that is applied to the control input that sets the total delay to a delay that locks the delay locked loop;

an N:1 multiplexer receiving signals from each of the N output taps and providing a multiplexer output signal under control of a select signal;

a passive secondary delay circuit having an input receiving the multiplexer output signal, and having a plurality of M output taps at each of a plurality of M passive delay elements each having a delay $D_p$ the secondary delay circuit having a total delay of approximately $M \times D_p$ that is set by a control signal, the control signal being determined by a tuning signal from the primary delay line that establishes a global average tuning;

an output control circuit that selects one or more taps from the primary delay line and the secondary delay circuit as an output;

a memory cell receiving the signal from the primary delay line and storing the global average tuning, and wherein the control signal to the passive secondary delay circuit is received as a fixed value of a global average tuning stored in the memory cell; and wherein the delay $D_p$ of each of the M passive delay elements is set by a corresponding one of M control inputs.

28. The apparatus according to claim 27, wherein each of the M control inputs receives a control signal comprising a global average tuning value added to one of M individual delay element tuning values.

29. The apparatus according to claim 28, wherein the global average tuning value is determined from a tuning signal from the primary delay line.

30. The apparatus according to claim 29, further comprising a memory cell receiving a signal from the primary delay line and storing the global average tuning.

31. The apparatus according to claim 29, wherein each of the M individual delay element tuning values is stored in one of M memories.

32. The apparatus according to claim 28, wherein the M individual delay element tuning values are determined based upon delay value variations in each of the M passive delay elements.

33. A delay locked loop circuit, comprising:
a primary delay line having an input that receives a clock signal, having an output and having a plurality of N output taps from a plurality of delay elements, the primary delay line further having a control input that controls an amount of delay D of delay elements based upon a control signal applied thereto, the primary delay line having a total delay of N×D;
a phase comparator that compares the phase of the primary delay line input with the primary delay line output and generates the control signal that is applied to the control input that sets the total delay to a delay that locks the delay locked loop;
an N:1 multiplexer receiving signals from each of the N output taps and providing a multiplexer output signal under control of a select signal;
a passive secondary delay circuit having an input receiving the multiplexer output signal, and having a plurality of M output taps at each of a plurality of M passive delay elements each having a delay $D_p$, the secondary delay circuit having a total delay of approximately $M \times D_p$;
an output control circuit that selects one or more taps from the primary delay line and the secondary delay circuit as an output; and
wherein the output control circuit receives a digital frequency selection signal having least significant bits and most significant bits, and wherein the select signal comprises the most significant bits and wherein a tap in the secondary delay line is selected by addressing a tap corresponding to the least significant bits.

34. A delay locked loop circuit, comprising:
a primary delay line having an input that receives a clock signal, having an output and having a plurality of N output taps from a plurality of N delay elements, the primary delay line further having a control input that controls an amount of delay D of delay elements based upon a control signal applied thereto, the primary delay line having a total delay of N×D;
a phase comparator that compares the phase of the primary delay line input with the primary delay line output and generates the control signal that sets the total delay to a delay that locks the delay locked loop circuit;
an N:1 multiplexer receiving signals from each of the N output taps and providing a multiplexer output signal under control of a select signal;
a secondary delay circuit having an input receiving the multiplexer output signal, and having a plurality of M output taps at each of a plurality of delay elements each having a delay $D_s$, the secondary delay circuit having a total delay of $M \times D_s$, where $M \times D_s$ is different than N×D;
an output control circuit that selects one or more output taps from either the primary delay line or the secondary delay circuit as an output; and
wherein the output control circuit selects taps based upon an algorithm that:
computes a ratio K.C of the clock signal's frequency to a desired output frequency where C is a fractional part and K is an integer part of the ratio;
identifies a sequence of taps constituting a repeating tap cycle at approximately equally spaced delay increments, wherein a $j^{th}$ tap address $C_j$ is defined by $C_j = C_{j-1} C$.

35. The apparatus according to claim 34, further comprising sequentially selecting identified taps to produce an output at time increments approximating K.C×N×D.

36. The apparatus according to claim 35, wherein the output control circuit selects taps based upon an algorithm that interpolates fractional tap values by selecting integer tap values that vary as the tap cycle repeats.

37. A method of selecting output taps in a delay locked loop frequency synthesizer having a primary delay line forming part of a primary delay locked loop and one or more secondary delay lines forming one or more secondary delay locked loops, comprising:
computing a ratio K.C of the clock signal's frequency to a desired output frequency where C is a fractional part and K is an integer part of the ratio;
identifying a sequence of taps constituting a repeating tap cycle in the one or more secondary delay lines at approximately equally spaced delay increments, wherein a $j^{th}$ tap address $C_j$ is defined by $C_j = C_j C$; and
sequentially selecting identified taps to produce an output at time increments approximating K.C times the total delay of the primary delay line.

38. A method of selecting output taps in a delay locked loop frequency synthesizer having a primary delay line forming part of a primary delay locked loop and one or more secondary delay lines forming one or more secondary delay locked loops, comprising:
computing a ratio K.C of the clock signal's frequency to a desired output frequency where C is a fractional part and K is an integer part of the ratio; and
identifying a sequence of taps constituting a repeating rap cycle in the one or more secondary delay lines at approximately equally spaced delay increments, wherein a $j^{th}$ tap address $C_j$ is defined by $C_j = C_{j-1} + C$; and
wherein the output control circuit selects taps based upon an algorithm that interpolates fractional tap values by selecting integer tap values that vary as the tap cycle repeats.

* * * * *